United States Patent
Cottier et al.

(10) Patent No.: US 7,187,614 B2
(45) Date of Patent: Mar. 6, 2007

(54) ARRAY READ ACCESS CONTROL USING MUX SELECT SIGNAL GATING OF THE READ PORT

(75) Inventors: Scott Raymond Cottier, Cedar Park, TX (US); Peichun Peter Liu, Austin, TX (US); Shohji Onishi, Shiga-ken (JP)

(73) Assignee: International Business Machines Corporation, Armonk, NY (US)

( * ) Notice: Subject to any disclaimer, the term of this patent is extended or adjusted under 35 U.S.C. 154(b) by 113 days.

(21) Appl. No.: 10/965,626

(22) Filed: Oct. 14, 2004

(65) Prior Publication Data

US 2006/0083074 A1    Apr. 20, 2006

(51) Int. Cl.
G11C 8/00    (2006.01)

(52) U.S. Cl. ............................ 365/230.05; 365/230.06; 365/154

(58) Field of Classification Search ........... 365/230.05, 365/230.06, 156, 154, 203, 189.11
See application file for complete search history.

(56) References Cited

U.S. PATENT DOCUMENTS

| | | | | |
|---|---|---|---|---|
| 5,790,454 | A | * | 8/1998 | Choi ..................... 365/185.03 |
| 2002/0196667 | A1 | * | 12/2002 | Ikehashi et al. ....... 365/185.24 |

* cited by examiner

Primary Examiner—Gene N. Auduong
(74) Attorney, Agent, or Firm—Stephen R. Tkacs; Stephen J. Walder, Jr.; Diana R. Gerhardt

(57) ABSTRACT

An apparatus, a method, and a computer program product are provided for time reduction for an array read access control consisting of a bitcell with logic gating and a pull down device included, therein. To reduce gate delay this design implements gating logic inside the bitcell. The multiplex select gating signals are brought into the bitcell, and are gated with the data array. The gating logic controls the pull down device, and MUX select signals can be produced as a readout of the bitcell. This design reduces gate delay because the dependency upon the gating logic is overridden and the number of stages is reduced.

20 Claims, 5 Drawing Sheets

ARRAY READ ACCESS CONTROL USING MUX SELECT SIGNAL GATING OF THE READ PORT

FIELD OF THE INVENTION

The present invention relates generally to array read access control, and more particularly, to array read access consisting of bitcells with gating logic included that are designed to reduce gate delay when producing MUX select signals.

DESCRIPTION OF THE RELATED ART

Standard bitcells and array read access controls are used in data processing systems to perform the function of accepting written data, storing this data in arrays, reading this data and then transforming the data into decoded select signals. Usually, these devices consist of a conventional bitcell with a read port followed by specific gating logic to produce the desired MUX select signals. After a write is performed and stored as data in an array, the bitcell will produce a readout that will be gated to produce the MUX select signals. A read of the data array must be completed before the bitcell readout can be gated outside of the bitcell. Any operation that is based upon the read result from the bitcell will require additional cycles, which increases the time delay of the circuit.

Referring to FIG. 1 of the drawings, the reference numeral 100 schematically depicts a conventional bitcell with a read port. The write wordline 105, is connected to the gates of two nFET transistors 120 and 125. The write bitline 110 is connected to the source of nFET 120. The drain of nFET 120 is connected through junction 130 to an inverter 135. The output of inverter 135 is connected to junction 140, which is connected to the source of nFET 125. The complement of the write bitline 115 exists at the drain of nFET 125. At junction 140, another inverter 145 is connected with its output attached to junction 130. The two nFET transistors 120 and 125, and the two inverters in series 135 and 145, create a static memory cell 150, which maintains a constant value in the bitcell. When the write wordline 105 is on, the values on the write bitlines 110 and 115 will be passed to memory cell 150, and the memory cell 150 will hold new values at junctions 130 and 140. Junction 140 is also connected to the gate of nFET transistor 155.

The drain of nFET 155 is connected to the source of nFET transistor 170. The read wordline 160 is connected to the gate of nFET 170. A read will occur when the read wordline 160 is activated. The bitcell value will determine the value of the read. The drain of nFET 170 is the read bitline 165. The nFET transistors 170 and 155 make up the pull down device 175, and both transistors must be activated before the read bitline 165 will be pulled down. The pull down device 175 initiates the read. If nFET 155 is activated, the read bitline 165 will pull down. If nFET 155 is not activated, then the read bitline 165 will maintain its precharged state. The source of nFET 155 is connected to ground 180. The pull down device 175 allows the signal that has been read to be pulled down as a readout of the read bitline 165. At this point the readout can be gated to produce the MUX select signals.

Referring to FIG. 2 of the drawings, the reference numeral 200 illustrates a block diagram depicting a conventional array read access control comprising a readout of a standard bitcell followed by signal gating. The bitcell 208 corresponds to FIG. 1, reference numeral 100. The Array Bit Slice 205 depicts an array of these conventional bitcells 208, as they would exist in a processor. The readout 210 corresponds to the read bitline 165 in FIG. 1. This readout signal 210 is produced by a conventional bitcell with a read port. The readout 210 is then connected to the specific gating logic 220 as an input. The multiplex gating signals 215 are also connected to the gating logic 220 as the other input. The MUX select signals 225 are the decoded signals produced by the gating logic 220. This diagram shows that a conventional array read involves two separate steps to produce the desired select signals. The bitcell provides the data which will be read out of the array. The read wordline 160 (FIG. 1) will activate the read, and the value of the read will determine whether the read bitline 165 (FIG. 1) gets pulled down or remains precharged. After this step the readout signals 210 and the gating signals 215 are gated to produce the MUX select signals.

These separate steps lead to a time delay that was previously described. Any operation that requires a readout signal from the bitcell will require additional clock cycles. Additional delay in this process causes the array read timing operation to become more critical. This result forces the array read devices to be designed with timing constraints as the primary issue. If timing issues are less significant, then array read devices can be designed to be smaller in area, more reliable and/or more power efficient. Therefore, there is a need to reduce the time delay involved with conventional array read access controls.

SUMMARY OF THE INVENTION

The present invention provides a method, an apparatus, and a computer program for the reduction of time delay for array read access controls consisting of a bitcell with gating logic and a pull down device included, therein. Gating logic is brought into the bitcell, which allows for a reduction in gate delay. Because the gating of the data array can be accomplished before a complete read of the data array, the number of stages is reduced. The multiplex select gating signals are brought into the bitcell and gated with the data array. This allows the gating logic to control the pull down device, and the readout of the bitcell is no longer required to be gated. As a result of this time delay reduction, the array read timing operation becomes less critical and the devices may be sized to achieve greater reliability and/or lower power consumption.

BRIEF DESCRIPTION OF THE DRAWINGS

For a more complete understanding of the present invention and the advantages thereof, reference is now made to the following descriptions taken in conjunction with the accompanying drawings, in which.

DETAILED DESCRIPTION

In the following discussion, numerous specific details are set forth to provide a thorough understanding of the present invention. However, those skilled in the art will appreciate that the present invention may be practiced without such specific details. In other instances, well-known elements have been illustrated in schematic or block diagram form in order not to obscure the present invention in unnecessary detail. Additionally, for the most part, details concerning network communications, electromagnetic signaling techniques, and the like, have been omitted inasmuch as such details are not considered necessary to obtain a complete understanding of the present invention, and are considered to be within the understanding of persons of ordinary skill in the relevant art.

Figure 1:
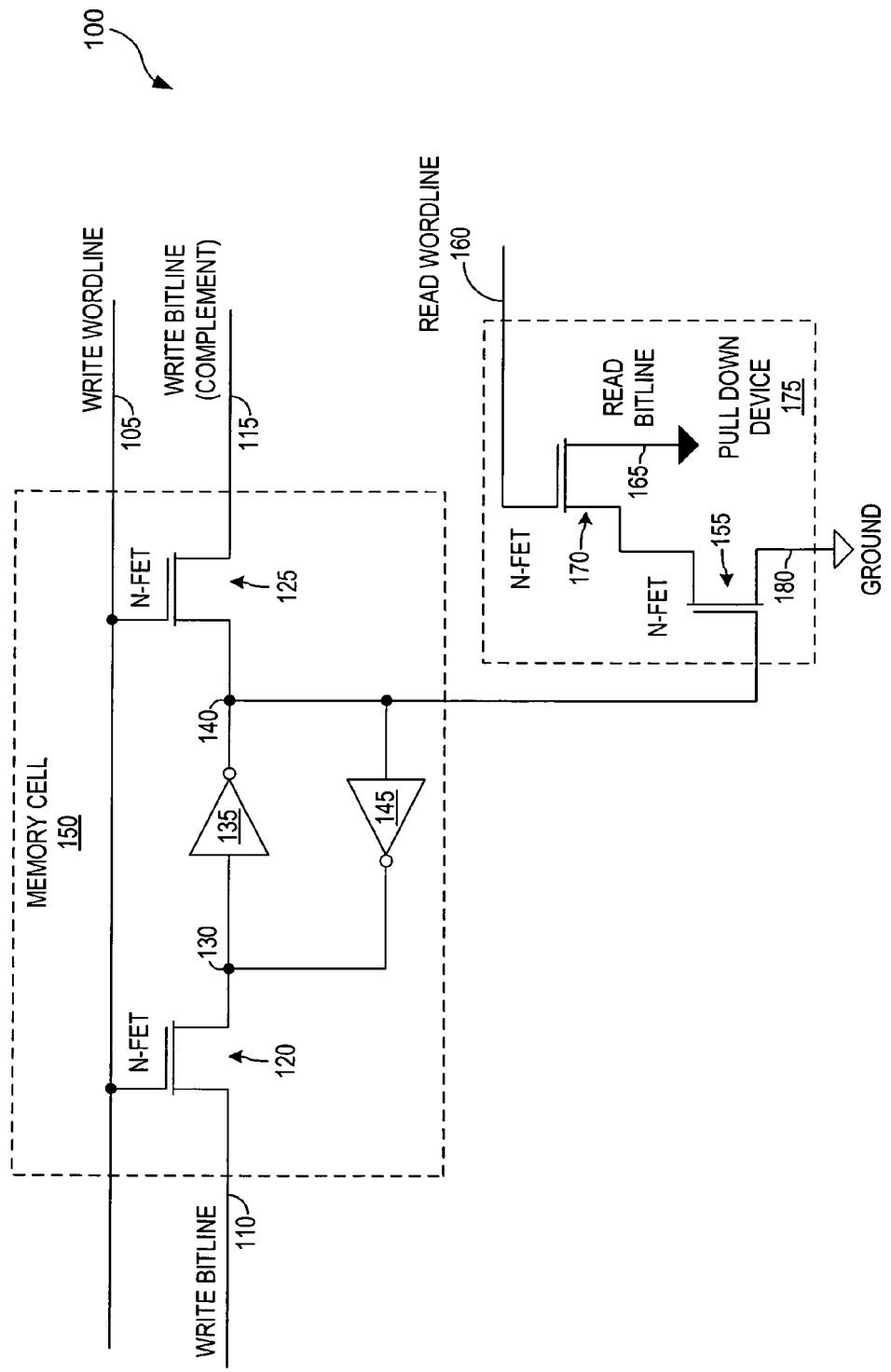
FIG. 1 schematically depicts a conventional bitcell with a read port.
Figure 2:
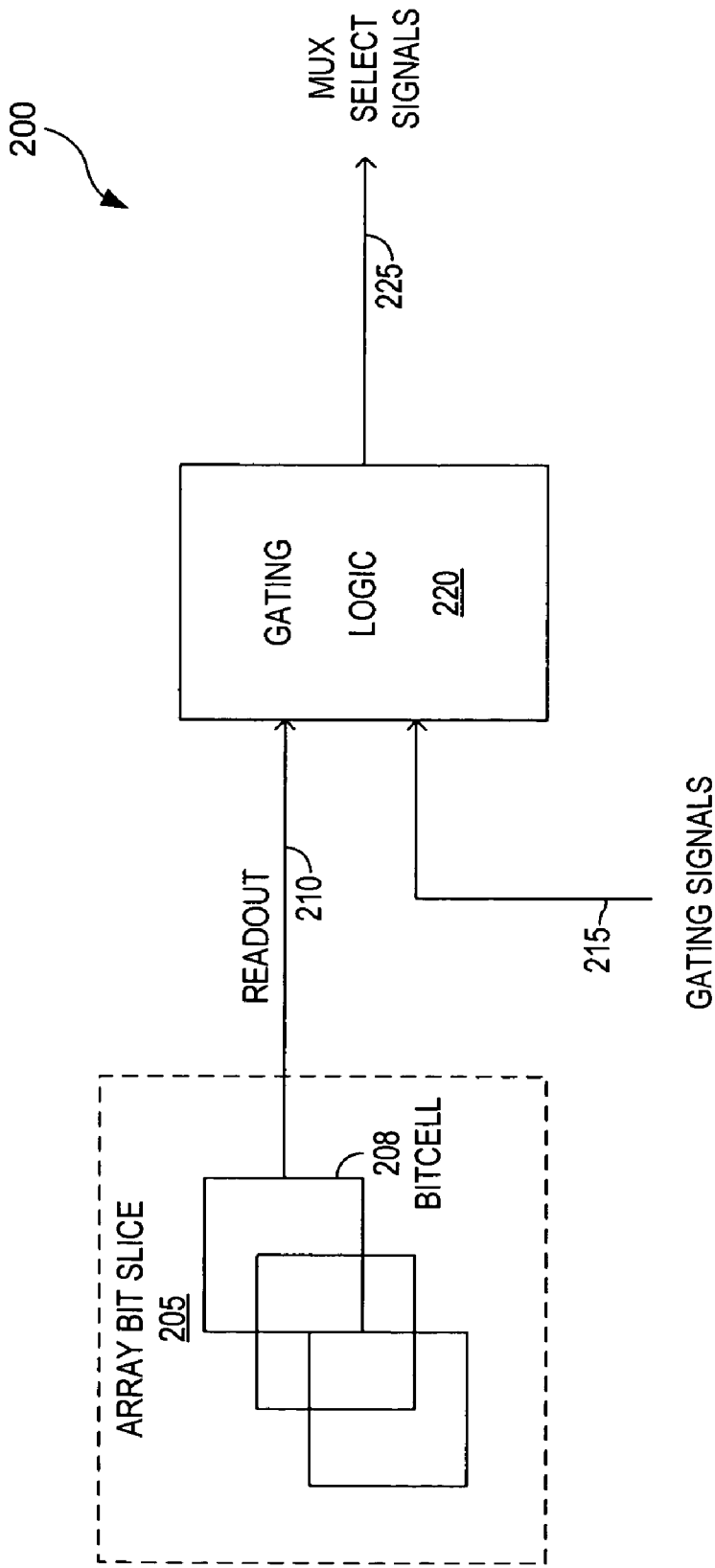
FIG. 2 is a block diagram depicting a conventional array read access control.
Figure 3:
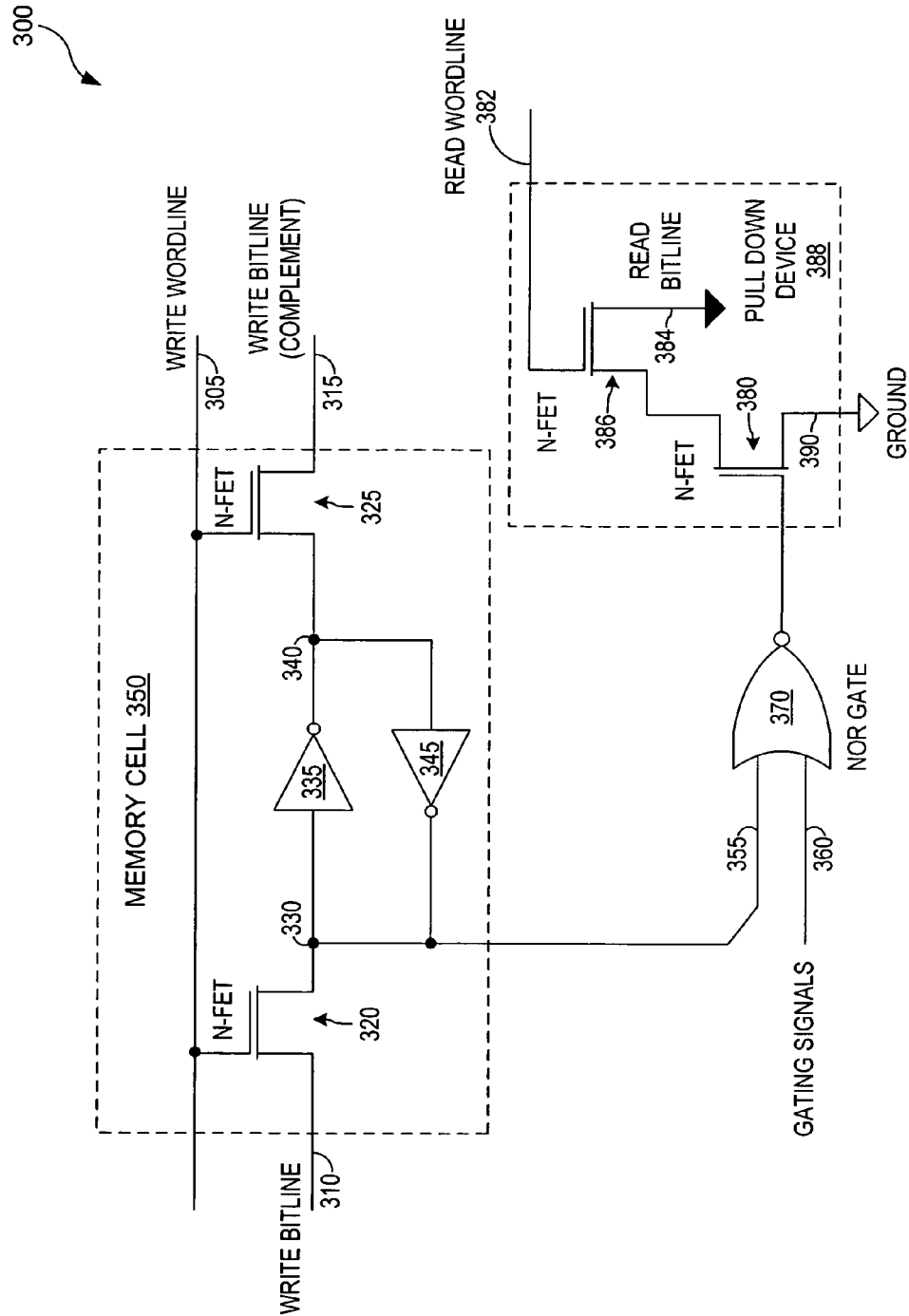
FIG. 3 schematically depicts a modified bitcell with a read port and the necessary gating logic included.

Referring to FIG. 3 of the drawings, the reference numeral 300 generally designates a modified bitcell with a read port and the necessary gating logic included. The write wordline 305, is connected to the gate of two nFET transistors 320 and 325. The write bitline 310 is connected to the source of nFET 320. The drain of nFET 320 is connected through junction 330 to an inverter 335. The output of inverter 335 is connected to junction 340, which is connected to the source of nFET 325. The complement of the write bitline 315 exists at the drain of nFET 325. At junction 340, another inverter 345 is connected with its output attached to junction 330. The two nFET transistors 320 and 325, and the two inverters in series 335 and 345, create a static memory cell 350, which maintains a constant value in the bitcell. When the write wordline 305 is on, the values on the write bitlines 310 and 315 will be passed to the memory cell 350, and the memory cell 350 will hold new values at junctions 330 and 340.

Junction 330 is connected to a NOR gate 370 as an input through communication channel 355. Communication channel 355 can be connected to junction 330 or 340. Therefore, communication channel 355 can be used to carry the true bitline signal at junction 330 or the complement bitline signal at junction 340. The gating signals 360 provide the other input for the NOR gate 370. The output of the NOR gate 370 is connected to the gate of nFET transistor 380. The drain of nFET 380 is connected to the source of nFET 386. The drain of nFET 386 is the read bitline 384. The gate of nFET 386 is connected to the read wordline 382. The source of nFET 380 is connected to ground 390. The pull down device 388 consists of nFET 380 and nFET 386. The pull down device 388 will pull down the read bitline 384 producing the readout of the bitcell. The activation of nFETs 380 and 386 is required to pull down the read bitline 384. Therefore, in this design both the gating signals 360 and the junction 330 must have the logical value of "0" for the read bitline 384 to be pulled down.

To achieve this result the array data is gated with the gating signals 360 (this occurs during the address decode for the read wordline). Essentially, the gating of the array data with the gating signals produces a decoded signal before the read is activated. For example, a 5:1 multiplexer has four of the five select signals stored in the array as 1-hot and the remaining, multiplex select signal, exists outside of the array. The values of all five select signals must be 1-hot when controlling the multiplexer. Previous methods require an array read followed by the gating of the array readout data to insure the 1-hot condition among all five signals. This modified design brings the multiplex select signal into the bitcell as an input and the gating can be performed before the read is activated. The multiplex select signal is denoted as gating signals 360. The inclusion of this NOR gate inside the array bitcell allows for the timing dependency on the gating logic to be overridden and the number of stages reduced. The gating logic is completely static. Now, the readout of the array is a fully decoded representation of the stored array data plus the master select signal. This is a clear reduction of gate delay stages in these high frequency array reads. A reduction of gate delay stages in high frequency array designs is critical for achieving desired cycle times.

FIG. 3 illustrates a NOR gate 370 as the gating logic used in this bitcell, but other gating logic may be used. The gating signals 360 in FIG. 3 only provides one input, but more inputs are possible with the correct gating logic. In this design the read wordline is a pulsed clock signal that controls when the pull down device is activated. Only one clock signal is used for the reading and the pulling down of the bitline and timing issues are minimal. The activation of the read wordline 382 and the write wordline 305 must be mutually exclusive.

Figure 4:
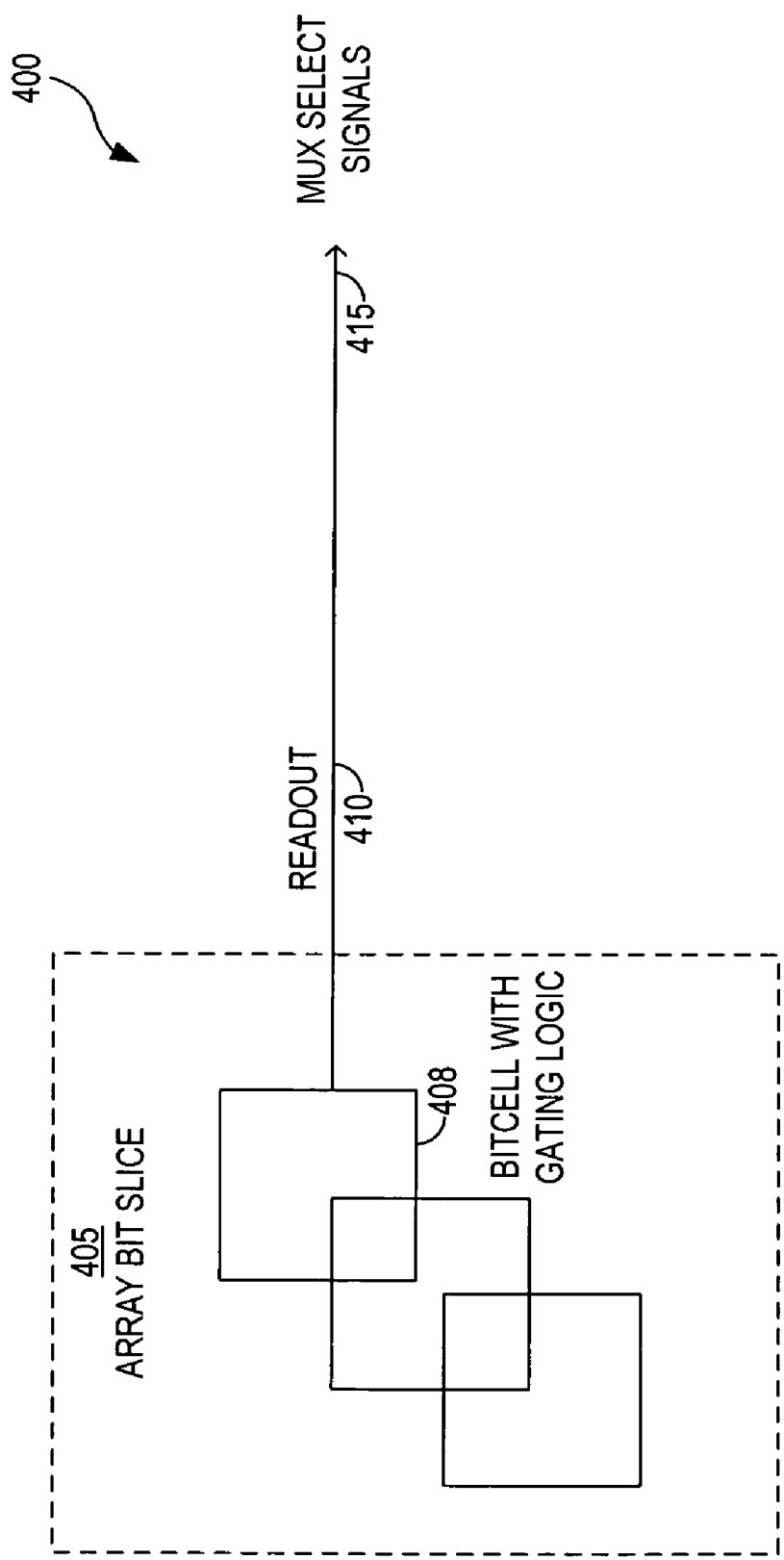
FIG. 4 is a block diagram depicting a modified array read access control without the gating logic outside of the bitcell.

Referring to FIG. 4 of the drawings, reference numeral 400 depicts a block diagram illustrating a modified array read access control with no gating logic following the bitcell readout. The Bitcell with Gating Logic 408 corresponds to reference numeral 300 in FIG. 3. The Array Bit Slice 405 denotes an array of bitcells as they would exist in a processor. The readout 410 corresponds with the read bitline 384 in FIG. 3. The readout of the bitcell 410 is the fully decoded MUX select signals 415. As shown in FIG. 4, no gating logic is needed because the MUX select signals 415 are fully decoded by the Bitcell with Gating Logic 408. As a result of this time delay reduction, the array read timing operation becomes less critical and the devices may be sized to achieve greater reliability and/or lower power consumption.

Figure 5:
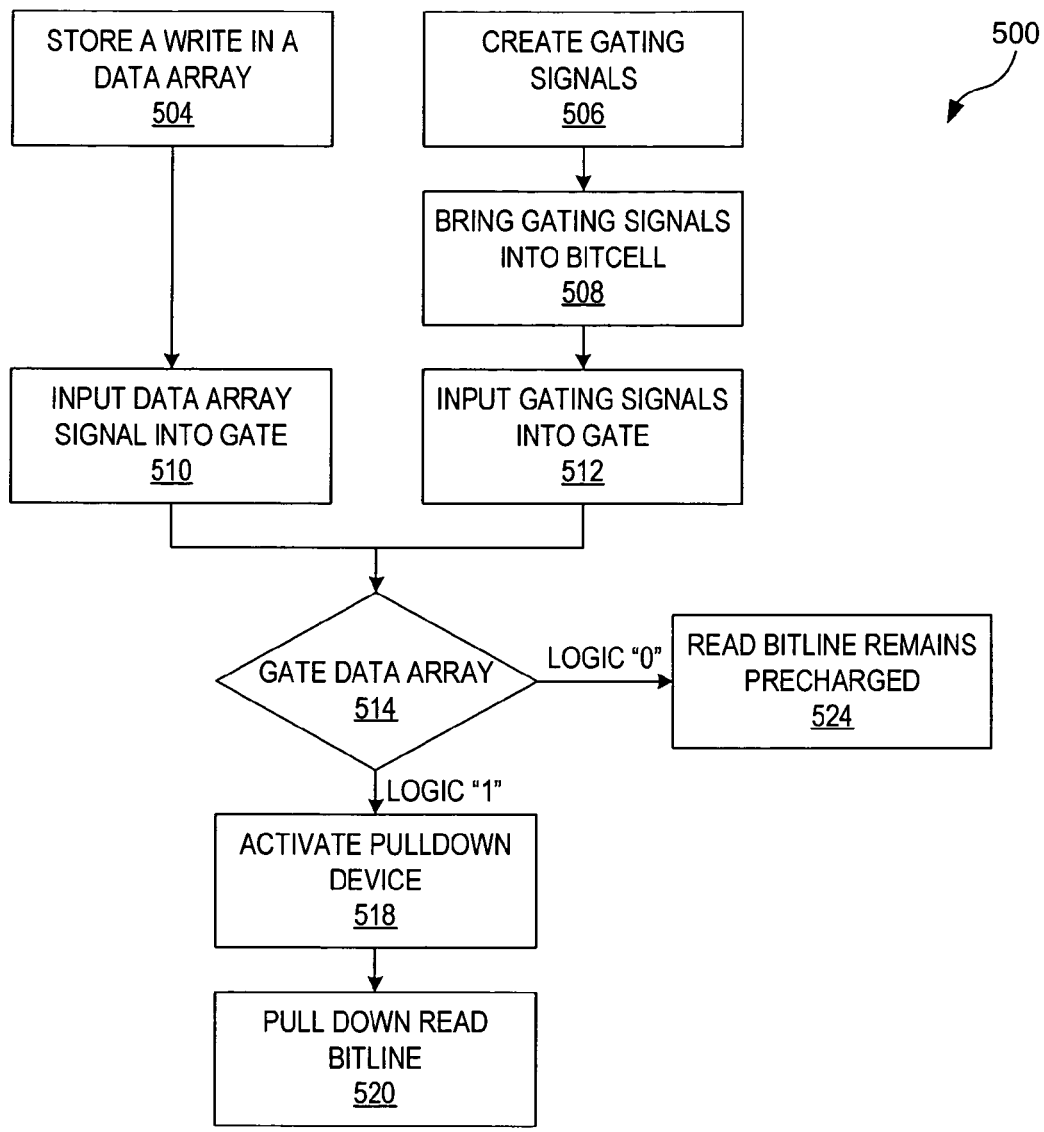
FIG. 5 is a flow chart depicting the array read process inside the modified bitcell.

Referring to FIG. 5 of the drawings, reference numeral 500 depicts a flow chart illustrating the process of an array read in the modified bitcell with the gating logic included. The first step 506 of the process 500 involves producing the gating signals 360 outside of the modified bitcell 300. The gating signals 360 are then brought into the bitcell in step 508. If the write wordline 305 in the bitcell is activated, then in step 504 a write is stored as data in an array. Process step 510 denotes that this data array signal 355 is one input of the gating logic (NOR gate 370), and process step 512 denotes that the gating signals 360 are the other input of the gating logic. At this stage, the data array and the gating signals are gated as shown by step 514. If the output of the gating logic (NOR gate 370) is a logical "0," then step 524 denotes that the read bitline 384 remains precharged and is not pulled down. If the output of the gating logic (NOR gate 370) is a logical "1," then step 518 denotes that the pulldown device 388 is activated. When the pulldown device 388 is activated, then in step 520 the read bitline 384 is pulled down as a decoded readout 410.

It is understood that the present invention can take many forms and embodiments. Accordingly, several variations of the present design may be made without departing from the scope of the invention. The capabilities outlined herein allow for the possibility of a variety of programming models. This disclosure should not be read as preferring any particular programming model, but is instead directed to the underlying concepts on which these programming models can be built.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Many such variations and modifications may be considered desirable by those skilled in the art based upon a review of the foregoing description of preferred embodiments. Accordingly, it is appropriate that the appended claims be construed broadly and in a manner consistent with the scope of the invention.

The invention claimed is:

1. An array bitcell comprising:
   memory cell that is configured to hold a value;
   gating logic that is configured to gate the value based on a multiplex select gating signal to form a gated bitline signal; and
   a pull down device that is configured to receive the gated bitline signal and a read wordline signal and to produce a read bitline signal based on the gated bitline signal responsive to the read wordline signal being asserted.

2. The array bitcell of claim 1, wherein the gating logic comprises a NOR gate.

3. The array bitcell of claim 2, wherein the read wordline signal is a pulsed clock signal that is configured to activate the pull down device.

4. The array bitcell of claim 2, wherein the pull down device pulls down the gated bitline signal if the gated bitline signal and the multiplex select gating signal are deserted.

5. The array bitcell of claim 4, wherein the pull down device does not pull down the gated bitline signal if at least one of the gated bitline signal or the multiplex select gating signal is asserted.

6. The array bitcell of claim 1, wherein the memory cell is configured to receive a true write bitline signal, a complement write bitline signal, and a write wordline signal, and wherein the memory cell is configured to store the value based on the true write bitline signal and the complement write bitline signal, responsive to the write wordline signal being asserted.

7. The array bitcell of claim 1, wherein the gating logic produces the gated bitline signal prior to the read wordline being asserted.

8. A method for array read access control in an array bitcell comprising:
   receiving a multiplex select gating signal at the array bitcell;
   gating a value held in a memory cell within the array bitcell based on the multiplex select gating signal to form a gated bitline signal;
   receiving the gated bitline signal at a pull down device within the array bitcell; and
   generating a read bitline signal based on the gated bitline signal responsive to a read wordline signal being asserted.

9. The method of claim 6, wherein the step of gating the value held in the memory cell is performed using a NOR gate, wherein the NOR gate receives the multiplex select gating signal and a true bitline signal or a complement bitline signal from the memory cell as inputs.

10. The method of claim 8, further comprising:
    receiving at the memory cell a true write bitline signal, a complement write bitline signal, and a write wordline signal; and
    storing in the memory cell the value based on the true write bitline signal and the complement write bitline signal, responsive to the write wordline signal being asserted.

11. The method of claim 8, generating the read bitline signal comprises pulling down the gated bitline signal if the gated bitline signal and the multiplex select gating signal are deasserted.

12. The method of claim 11, generating the read bitline signal comprises not pulling down the gated bitline signal if at least one of the gated bitline signal or the multiplex select gating signal is asserted.

13. The method of claim 8, wherein gating the value held in the memory cell produces the gated bitline signal prior to the read wordline being asserted.

14. An array read access control apparatus, comprising:
    a plurality of array bitcells, wherein each array bitcell within the plurality of array bitcells comprises:
    a memory cell that is configured to hold a value;
    gating logic that is configured to gate the value based on a multiplex select gating signal to form a gated bitline signal; and
    a pull down device that is configured to receive the gated bitline signal and a read wordline signal and to produce a read bitline signal based on the gated bitline signal responsive to the read wordline signal being asserted, wherein the plurality of array bitcells generates a decoded readout signal.

15. The array read access control apparatus of claim 14, wherein the plurality of array bitcells generates the decoded readout signal with no gating logic following bitcell readout.

16. The array read access control apparatus of claim 14, wherein the plurality of array bitcells generates the decoded readout signal in one clock cycle.

17. The array read access control apparatus of claim 14, wherein the gating logic comprises a NOR gate.

18. The array read access control apparatus of claim 17, wherein the pull down device pulls down the gated bitline signal if the gated bitline signal and the multiplex select gating signal are deasserted.

19. The array read access control apparatus of claim 18, wherein the pull down device does not pull down the gated bitline signal if at least one of the gated bitline signal or the multiplex select gating signal is asserted.

20. The array read access control apparatus of claim 14, wherein the gating logic produces the gated bitline signal prior to the read wordline being asserted.

* * * * *